(12) United States Patent
Ohta

(10) Patent No.: US 8,125,081 B2
(45) Date of Patent: Feb. 28, 2012

(54) SEMICONDUCTOR DEVICE, PRINTED WIRING BOARD FOR MOUNTING THE SEMICONDUCTOR DEVICE AND CONNECTING STRUCTURE FOR THESE

(75) Inventor: Hironori Ohta, Tokyo (JP)

(73) Assignee: NEC Corporation, Tokyo (JP)

( * ) Notice: Subject to any disclaimer, the term of this patent is extended or adjusted under 35 U.S.C. 154(b) by 347 days.

(21) Appl. No.: 12/160,974

(22) PCT Filed: Jan. 10, 2007

(86) PCT No.: PCT/JP2007/050116
§ 371 (c)(1),
(2), (4) Date: Jul. 15, 2008

(87) PCT Pub. No.: WO2007/080863
PCT Pub. Date: Jul. 19, 2007

(65) Prior Publication Data
US 2010/0193948 A1 Aug. 5, 2010

(30) Foreign Application Priority Data
Jan. 16, 2006 (JP) .................. 2006-007734

(51) Int. Cl.
*H01L 23/12* (2006.01)
(52) U.S. Cl. ................. 257/731; 257/E23.069; 257/733; 257/780; 438/613
(58) Field of Classification Search ........... 257/E23.069, 257/737–739, 773, 775, 776, 779, 780, 786, 257/731–733; 174/267; 361/773; 438/117, 438/613
See application file for complete search history.

(56) References Cited

U.S. PATENT DOCUMENTS

| | | | | |
|---|---|---|---|---|
| 4,172,907 A * | 10/1979 | Mones et al. | ................. | 438/759 |
| 4,518,112 A * | 5/1985 | Miller et al. | ............... | 228/124.1 |
| 4,824,009 A * | 4/1989 | Master et al. | ............... | 228/124.1 |
| 5,468,995 A * | 11/1995 | Higgins, III | ................. | 257/697 |
| 5,670,418 A * | 9/1997 | Ghosal | .......................... | 438/613 |
| 5,773,889 A * | 6/1998 | Love et al. | .................... | 257/737 |
| 5,914,274 A * | 6/1999 | Yamaguchi et al. | .......... | 438/690 |
| 6,307,161 B1 * | 10/2001 | Grube et al. | .................. | 174/260 |
| 6,573,458 B1 * | 6/2003 | Matsubara et al. | ........... | 174/260 |
| 6,690,090 B2 * | 2/2004 | Kimura | ........................ | 257/738 |
| 6,727,579 B1 * | 4/2004 | Eldridge et al. | .............. | 257/692 |
| 6,774,315 B1 * | 8/2004 | Pierson et al. | ................ | 174/261 |
| 6,784,543 B2 * | 8/2004 | Matsuki et al. | ............... | 257/746 |

(Continued)

FOREIGN PATENT DOCUMENTS
JP 01-222467 9/1989
(Continued)

*Primary Examiner* — Chris Chu
(74) *Attorney, Agent, or Firm* — Dickstein Shapiro LLP

(57) ABSTRACT

The present invention relates to a connecting structure between semiconductor device 1 of a BGA type which has external electrode terminals 9 including column-like electrode 17, insulating layer 16 formed around the column-like electrode 17 and annular electrode 15 formed around the insulating layer 16, and a printed wiring board capable of mounting the semiconductor device 1 and including lower-layer electrode 28 to be soldered to column-like electrode 17 of the aforementioned external electrode terminal 9 and upper-layer electrode 27 to be soldered to annular electrode 15 of the aforementioned external electrode terminal 9. Column-like electrode 17 of semiconductor device 1 is soldered to lower-layer electrode 28 of printed wiring board 2. Annular electrode 15 of semiconductor device 1 is soldered to upper-layer electrode 27 of printed wiring board 2.

17 Claims, 11 Drawing Sheets

U.S. PATENT DOCUMENTS

| | | | |
|---|---|---|---|
| 6,828,669 B2 * | 12/2004 | Iijima et al. | 257/700 |
| 7,253,022 B2 * | 8/2007 | 'Khng et al. | 438/106 |
| 7,484,293 B2 * | 2/2009 | Yamaji et al. | 29/840 |
| 7,576,423 B2 * | 8/2009 | Takagi | 257/699 |
| 7,624,501 B2 * | 12/2009 | Machida | 29/846 |
| 7,667,473 B1 * | 2/2010 | Conn et al. | 324/755 |
| 7,732,713 B2 * | 6/2010 | Grube et al. | 174/267 |
| 7,795,739 B2 * | 9/2010 | Kurihara et al. | 257/774 |
| 2007/0269928 A1 * | 11/2007 | Farooq et al. | 438/108 |

FOREIGN PATENT DOCUMENTS

| | | |
|---|---|---|
| JP | 04-340732 | 11/1992 |
| JP | 06-013524 | 1/1994 |
| JP | 07-022461 | 1/1995 |
| JP | 2000-261121 | 9/2000 |
| JP | 2003-243439 | 8/2003 |

* cited by examiner

Fig. 10
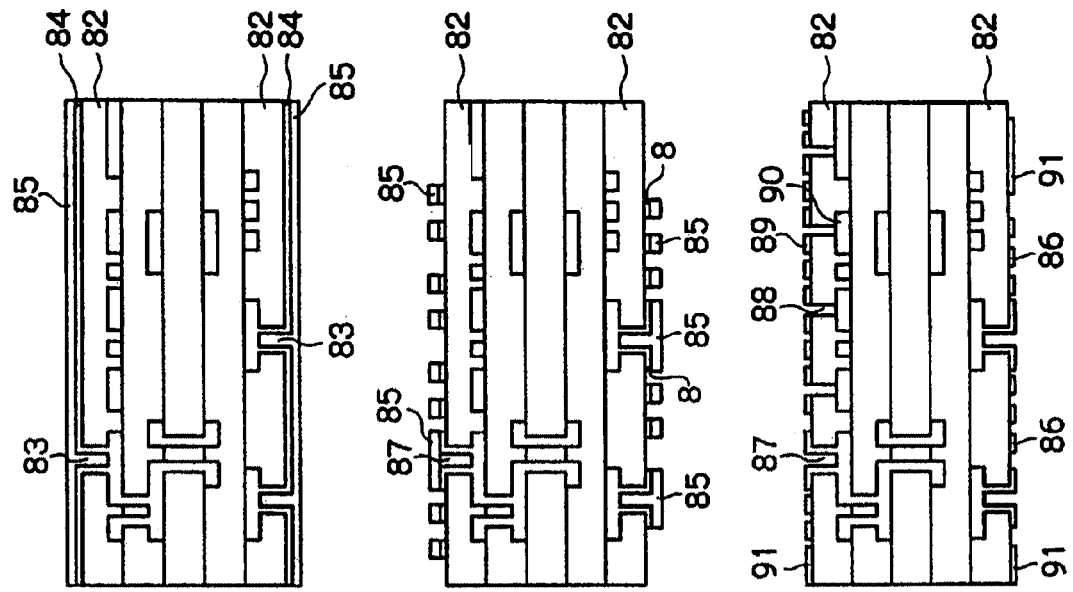
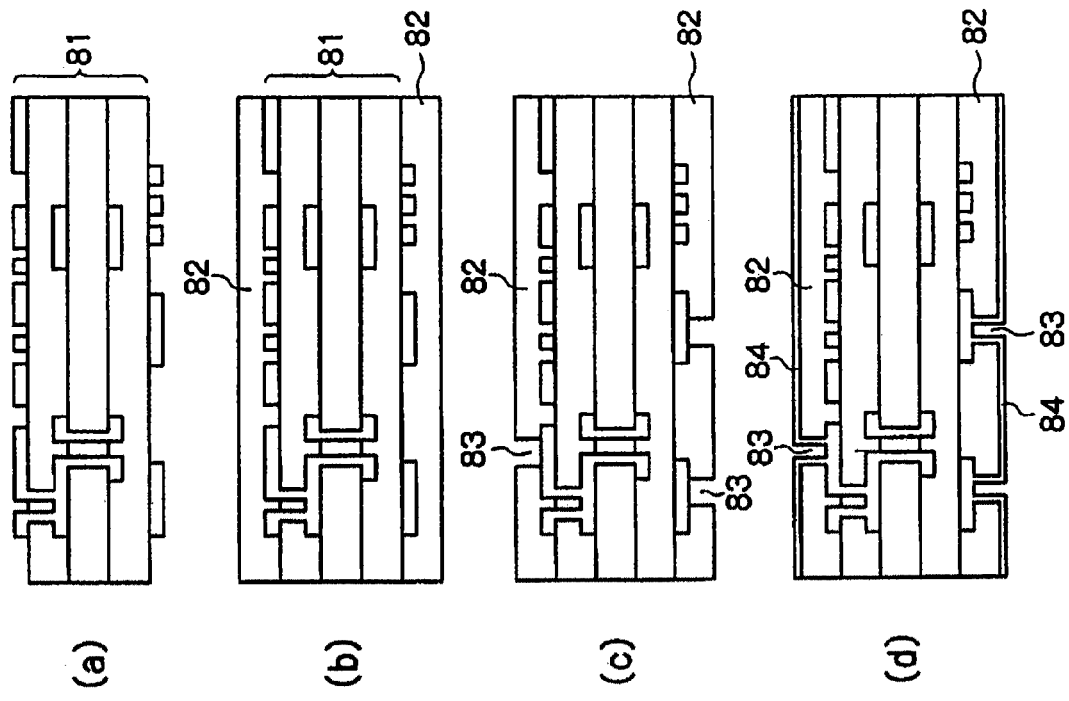

SEMICONDUCTOR DEVICE, PRINTED WIRING BOARD FOR MOUNTING THE SEMICONDUCTOR DEVICE AND CONNECTING STRUCTURE FOR THESE

TECHNICAL FIELD

The present invention relates to a semiconductor device of a BGA (Ball Grid Array) type, a printed wiring board for mounting the semiconductor device and a connecting structure for these.

BACKGROUND ART

With the miniaturization of electronic appliances and with the development of high-speed, high performance and multifunctional capability, demands for high density packaging of semiconductor devices have become stronger. As for the semiconductor device structures, adoption of BGA type semiconductor devices in which solder balls are arrayed on the underside in a grid pattern has increased replacing the lead-type semiconductor devices with external electrode terminals formed in a peripheral pattern. Further, with the miniaturization and thinning of BGA type semiconductor devices, adoption of CSP (Chip Scale Package/Chip Size Package) semiconductor devices having a size nearly equal to the size of the silicone chip is increasing. In order to achieve higher density packaging, multi chip packages, modules and the like of semiconductor devices having a plurality of silicon chips mounted thereon have been implemented. It is thought that with the further development of electronic appliances, there will be a continuous demand for miniaturization and semiconductor devices having high functionality.

Miniaturization and semiconductor devices having high functionality entail the narrowing of the pitch between its external electrode terminals and an increase in the number of pins. Narrowing of the pitch between external electrode terminals is addressed by reducing the size of the eternal electrode terminals and shortening the pitch between external electrode terminals. The minimum pitch that is achievable by the present SMT is 0.4 mm, and a further technical development for reducing the pitch is in progress. On the other hand, multiplication of pins or external electrode terminals is determined by adjusting the size of the interposer that holds a silicon chip of the semiconductor device thereon when external electrode terminals are arranged on the underside of the semiconductor device. When there are many electrode terminals, the size of the interposer is enlarged, or more explicitly, the semiconductor device is made large to address this situation.

FIG. 1 is a sectional diagram showing a semiconductor device of a conventional BGS type. In this semiconductor device 10, silicon chip 101 is mounted on interposer 102, and external electrode terminals 103 applied with solder 104 are formed in interposer 102. Narrowing the pitch between external electrode terminals is achieved by making the electrode terminal size small and reducing the distance between external electrode terminals. However, the actual situation is that when there is a greater number of electrode terminals, interposer 102 is made larger in size so as to accommodate the electrode terminals.

JP2000-261121A discloses a method of increasing the number of external electrode terminals without enlarging the semiconductor device size and the area of the printed wiring board on which the device is mounted. FIG. 2 shows a semiconductor device and its mounting method proposed in JP2000-261121A. This relates to a semiconductor device of a PGA (Ping Grid Array) type, the semiconductor device 111 having coaxial element 115 formed at the root of pin-shaped electrode 112 with cylindrical insulator 114 interposed therebetween. The method of mounting this PGA type semiconductor device to the printed wiring board is realized in the following manner. Solder paste 117 is applied first to the periphery of through-hole 119 of printed wiring board 118. Pin-shaped electrode 112 of PGA type semiconductor device 111 is inserted into through-hole 119 of printed wiring board 118. Next, reflow heating is performed to fuse and join solder paste 117, then flow heating is performed on solder pin-shaped electrode 112 to through-hole 119.

The above-described conventional technology has several problems as follows.

In the conventional BGA type semiconductor device 100 shown in FIG. 1, the limit of narrowing the pitch between external electrode terminals 103 with solder 104 is about 0.4 mm, which is the minimum pitch achieved by the existing SMT packaging technology. Technologies for narrowing the pitch equal to or lower than this are at present under development. The number of arrangeable external electrode terminals is determined depending on both the pitch between external electrode terminals and the area of the semiconductor device, and becomes maximum when external electrode terminals are arranged on the undersurface of the semiconductor device in a square grid pattern having a pitch of about 0.4 mm. Also, it is possible to arrange a greater number of external electrode terminals by enlarging the size of interposer 102 of the semiconductor device.

However, increasing the size of interposer 102 means enlargement of semiconductor device 100, which goes against the trend toward miniaturization. Further, the greater in size the semiconductor device is, the more deformed is the solder that joins the semiconductor device and the printed wiring board, leading to lower reliability.

The above-described JP2000-261121A also proposes a method of increasing the number of pins without size enlargement of semiconductor device 111. However, this is aimed at printed wiring board 118 having PGA type semiconductor device 111 and through holes 119. Since this PGA type semiconductor device 111 is a part of a type that is mounted by insertion into through holes 119 of the printed wiring board, this method cannot be used for a surface mount board having no through-holes 119 for parts insertion. On the other hand, when there are both insert mount parts and surface mount parts, it is possible to use the aforementioned PGA type semiconductor device. However, this method entails the problem of requiring a complicated process of reflow soldering and flow soldering in combination.

Alternatively, in the above-described JP2000-261121A, when surface mounting is attempted by cutting pin-shaped electrodes 112 but not cutting coaxial electrode 115 portions of external electrode terminals of PGA type semiconductor device 111, it is necessary to supply solder for joining electrode pads formed on printed wiring board 118 with cut surface portion of pin-shaped electrode 112, and coaxial electrode 115 portion of semiconductor device 111. In this case, the supplied amount of solder will be controlled depending on the metal mask conditions. However, on the electrode pads on the printed wiring board side there is no insulation between the pad that receives the cut surface portion of pin-shaped electrode 112 and the pad that receives coaxial electrode 115 portion, hence it is thought that a bridge etc. is prone to occur when semiconductor device 111 is mounted. Further, the pitch between external electrode terminals in PGA type semiconductor device 111 is usually 2.54 mm, higher density mounting is difficult to achieve in comparison with a semiconductor device of a BGA type, even when the device is used for surface mounting by cutting pin-shaped electrodes 112.

DISCLOSURE OF INVENTION

The present invention has been devised to solve the above problems, it is therefore an object of the present invention to provide a BGA type semiconductor device having a large number of pin-shaped electrode terminals, which can be mounted without narrowing the pitch between external electrode terminals of the semiconductor device and without enlarging the size of the semiconductor device.

It is another object of the present invention to provide a printed wiring board on which such a semiconductor device can be mounted.

Also, it is still another object of the present invention to provide a connecting structure between a BGA type semiconductor device having a large number of pin-shaped electrode terminals and a printed wiring board on which the semiconductor device is to be mounted.

In order to solve the above problems, a semiconductor device of the present invention is a semiconductor device of a BGA type formed with external electrode terminals on the side that is mounted onto a printed wiring board, wherein said external electrode terminal includes: a column-like electrode; an insulating layer formed around the column-like electrode; and an annular electrode formed around the insulating layer.

According to this invention, since the external electrode terminal in which an annular electrode is formed around a column-like electrode with an insulating layer therebetween is provided, it is possible to provide an electrode terminal which permits two electric connections made up of the column-like electrode and annular electrode, instead of the electrode terminal which used to serve as a single electric connection in the conventional BGA type semiconductor device. As a result, it is possible to reduce the area for a unit number of electrode terminals by approximately half, hence it is possible to provide a BGA type semiconductor device having a large number of pins or external electrode terminals without narrowing the pitch between electrode terminals and without enlarging the size of the semiconductor device.

In the semiconductor device of the present invention, the height of said insulating layer may be approximately equal to that of said column-like electrode. According to this invention, since the height of the insulating layer is approximately equal to that of the column-like electrode, the column-like electrode and the electrode formed on the printed wiring board can be soldered after the insulating layer formed around the column-like electrode has abutted the insulating board of the printed wiring board. As a result, the semiconductor device can be mounted to the printed wiring board without the solder on the column-like electrode being electrically connected to the solder on the annular electrode.

In the semiconductor device of the present invention, the height of said insulating layer may be approximately equal to that of said annular electrode. According to this invention, since the height of the insulating layer is approximately equal to that of the annular electrode, there is the advantage that the size of the hole (via hole) for burying the external electrode terminal can be made small.

In the semiconductor device of the present invention, a bump-like solder layer that joins the surface of said column-like electrode and the surface of said annular electrode may be formed on the surface of said external electrode terminal. According to this invention, a bump-like solder layer that connects between the surface of the column-like electrode and the surface of the annular electrode is formed. This bump-like solder layer melts during reflowing after the device has been mounted on the printed wiring board and separates due to the surface tension of the solder during reflow toward the column-like electrode and annular electrode on the different sides of the insulating layer. As a result, the column-like electrode and annular electrode become soldered separately from each other, or are soldered to corresponding electrodes of the printed wiring board, separately.

In the semiconductor device of the present invention, a bump-like solder layer formed on the surface of said column-like electrode and a circular solder layer formed on the surface of said annular electrode may be formed separately on the surface of said external electrode terminal. According to this invention, the bump-like solder layer formed on the column-like electrode surface and the circular solder layer formed on the annular electrode surface melt at the time of reflowing after the device has been mounted on the printed wiring board. Then these solder layers formed on the column-like electrode and annular electrode are soldered to corresponding electrodes on the printed wiring board due to the surface tension of the solder during reflow.

Further, in order to solve the above problems, another printed wiring board of the present invention is a printed wiring board on which a semiconductor device of a BGA type including external electrode terminals can be mounted, comprised of a column-like electrode; an insulating layer formed around the column-like electrode; and an annular electrode formed around the insulating layer, and which includes electrode pads corresponding to said external electrode terminals, wherein said electrode pad comprises: a lower-layer electrode to be soldered to the column-like electrode of said external electrode terminal; and an upper-layer electrode to be soldered to the annular electrode of said external electrode terminal.

According to this invention, electrode pads corresponding to the external electrode terminals are provided and the electrode pad includes a lower-layer electrode to be soldered to the column-like electrode of the external electrode terminal and an upper-layer electrode to be soldered to the annular electrode of the external electrode terminal. Accordingly, the electrode pad which used to be a single electrically connecting portion in the conventional printed wiring board can be formed into a configuration of lower-layer and upper-layer electrodes so as to deal with two electric connections. As a result, it is possible to halve the area for the unit number of electrode pads, and hence to provide a printed wiring board on which a BGA type semiconductor device having an increased number of external electrode terminals can be mounted without narrowing the pitch between electrode pads and without enlarging the printed wiring board. Further, since it is possible to widen the pitch between electrode pads or to reduce the printed wiring board in size, the mounting quality and reliability can be improved.

In the printed wiring board of the present invention, it is preferred that the lower-layer electrode that is to be soldered to said column-like electrode be formed at the bottom of a hole that is formed on the printed wiring board surface, and that the upper-layer electrode that is to be soldered to said annular electrode be formed on the printed wiring board surface in an annular form that is approximately the same as said annular electrode.

According to this invention, since a lower-layer electrode and upper-layer electrode corresponding to an external electrode terminal provided for the semiconductor device are provided, and since the lower-layer electrode is soldered to the column-like electrode of the semiconductor device while the upper-layer electrode is soldered to the annular electrode of the semiconductor device, it is possible to provide a printed wiring board on which a BGA type semiconductor device of the present invention having an increased number of external electrode terminals can be mounted.

Also, in order to solve the above problems, the connecting structure of the present invention is a connecting structure between a semiconductor device of a BGA type which has external electrode terminals formed on the side that is mounted to a printed wiring board, the external electrode terminal comprising a column-like electrode, an insulating layer formed around the column-like electrode and an annular electrode formed around the insulating layer and a printed wiring board on which said semiconductor device can be mounted, comprising an electrode pad that has a lower-layer electrode to be soldered to the column-like electrode of said external electrode terminal and an upper-layer electrode to be soldered to the annular electrode of said external electrode terminal, wherein the column-like electrode of said semiconductor device is soldered to the lower-layer electrode of said printed wiring board and the annular electrode of said semiconductor device is soldered to the upper-layer electrode of said printed wiring board.

According to this invention, when a BGA type semiconductor device is mounted onto a printed wiring board, the column-like electrode of the semiconductor device is soldered to the lower-layer electrode of the printed wiring board while the annular electrode of the semiconductor device is soldered to the upper-layer electrode of the printed wiring board. The semiconductor device is mounted onto the printed wiring board by a conventional SMT mounting technique, and solder wets and spreads over the electrodes when the solder is melted from reflow heating. During the solder is melted, the solder can be separated due to the surface tension of the solder itself and due to the presence of the insulating layer between the column-like electrode and annular electrode of the semiconductor device, so as to be able to create the above-described two solder connections.

In the above way, since in the present invention two solder-connected structures are formed instead of a single solder-connected portion in the conventional connecting structure, it is possible to reduce the area required for the arrangement of electrodes by approximately half. It is therefore possible to increase the number of electrodes by approximately double, compared to the conventional BGA type semiconductor device, hence a semiconductor device having an increased number of pins can be mounted easily onto the printed wiring board without narrowing the pitch between external electrode terminals and without enlarging the size of the semiconductor device. Further, in the conventional BGA type semiconductor device, if it is not necessary to increase the number of external electrodes, adoption of the connecting structure of the present invention makes it possible to enlarge the pitch between electrodes, and hence to improve the mounting quality and reliability when the device is mounted to the printed wiring board.

In the connecting structure of the present invention, the lower-layer electrode to be soldered to said column-like electrode may be formed at the bottom of a hole formed on the printed wiring board surface, and the upper-layer electrode to be soldered to said annular electrode may be formed on the printed wiring board surface in an annular form that is approximately the same as said annular electrode.

According to this invention, since the lower-layer electrode to be connected to the column-like electrode is formed at the bottom of the hole that is formed in the printed wiring board surface, the column-like electrode of the semiconductor device is inserted into the hole formed on the printed wiring board surface so that the column-like electrode and the lower-layer electrode formed at the bottom of the hole are connected by the solder that has melted from reflow heating. On the other hand, since the upper-layer electrode to be soldered to the annular electrode is formed on the printed wiring board surface in an annular form that is approximately the same as the annular electrode, the annular electrode and the upper-layer electrode formed in approximately the same circular form as the annular electrode are joined by the molten solder from reflow heating.

In the connecting structure of the present invention, the height of said insulating layer may be approximately equal to that of said column-like electrode. According to this invention, since the height of the insulating layer is approximately equal to that of the column-like electrode, the column-like electrode and the electrode formed on the printed wiring board can be soldered after the insulating layer formed around the column-like electrode has abutted the insulating board of the printed wiring board. As a result, the semiconductor device can be mounted onto the printed wiring board without the solder on the column-like electrode being electrically connected to the solder on the annular electrode.

Also, the height of said insulating layer may be approximately equal to that of said annular electrode. According to this invention, since the height of the insulating layer is approximately equal to that of the annular electrode, there is the advantage that the size of the hole (via hole) for burying the external electrode terminal can be made small.

BRIEF DESCRIPTION OF THE DRAWINGS

FIG. 10 is a process diagram showing one example of a printed wiring board of the present invention.

BEST MODE FOR CARRYING OUT THE INVENTION

Next, the exemplary embodiment of the present invention will be described with reference to the drawings.

(Semiconductor Device)

Figure 3:
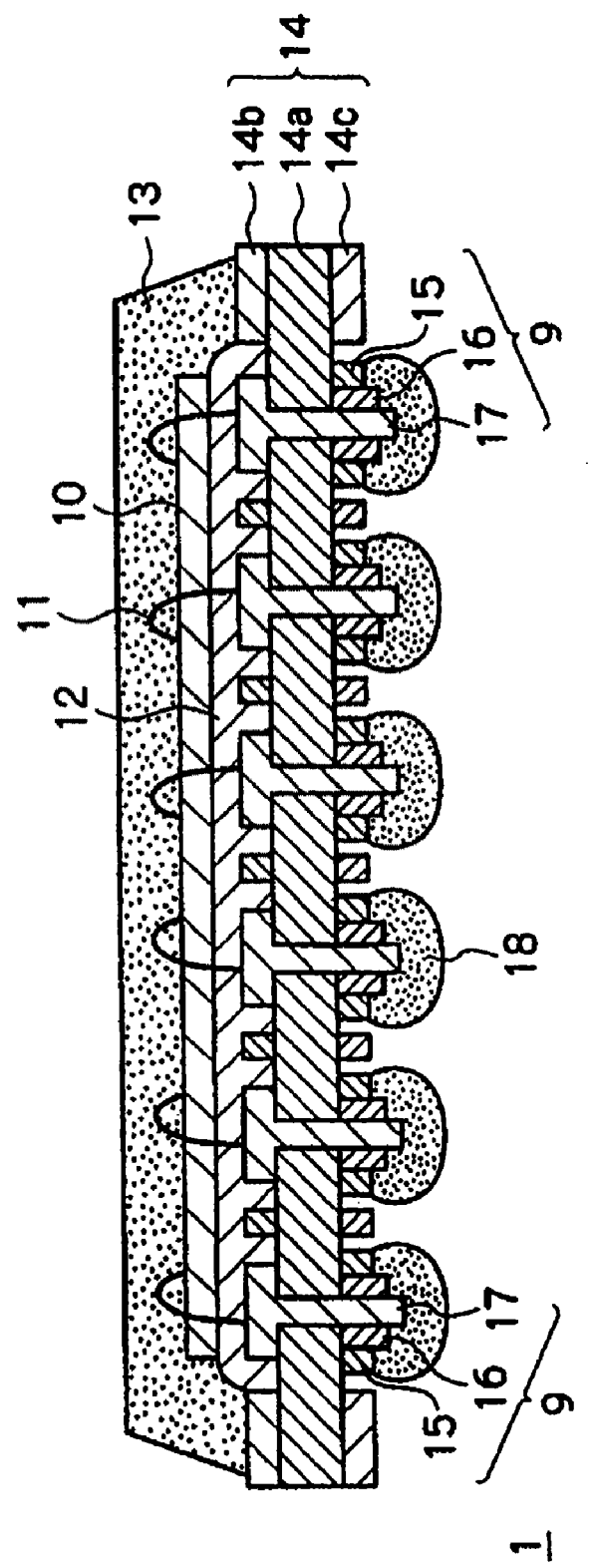
FIG. 3 is a schematic sectional diagram showing one example of a semiconductor device of the present invention.

FIG. 3 is a schematic sectional diagram showing one example of a semiconductor device of the present invention.

Semiconductor device 1 shown in FIG. 3 is a BGA type semiconductor device, including silicon chip mount board 14 (which will be simply referred to hereinbelow as "board 14"), silicon chip 10 mounted on one side of board 14 and external electrode terminals 9 which are formed so as to pass through board 14 with their tips exposed from the opposite side. External electrode terminal 9 is connected to wire 11 that is lead out from silicon chip 10 and is comprised of column-like electrode 17, insulating layer 16 provided around the column-like electrode 17 and annular electrode 15 provided around the insulating layer 16. This semiconductor device 1 is mounted such that column-like electrode 17 and annular electrode 15 holding insulating layer 16 therebetween function as electrode terminals and these terminals are soldered to the electrodes on the printed wiring board (see FIG. 11).

Figure 5:
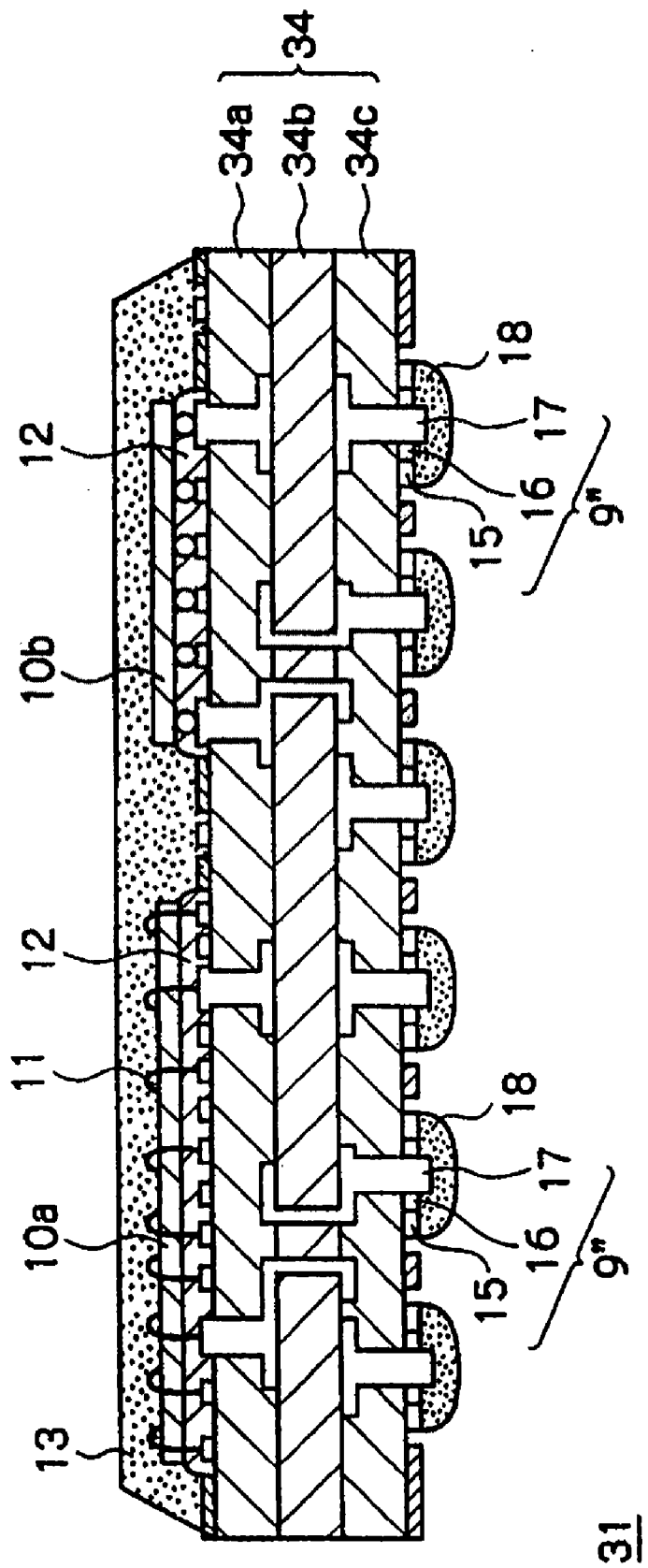
FIG. 5 is a schematic sectional diagram showing still another example of a semiconductor device of the present invention.

The configuration of board 14 is not particularly limited as long as it can mount silicon chip 10 and as long as wires lead out from the silicon chip 10 can be connected to external electrode terminals 9. For example, it may have a configuration in which copper interconnecting patterns 14b and 14c are formed on both sides of insulating board 14a as shown in FIG. 3, or it may have an aftermentioned configuration made up of multi-layered board 34 as shown in FIG. 5. As an example of board 14, boards of polyimide, epoxy and other resins, and such resin boards that contain fibers of glass etc., can be mentioned. The thickness of board 14 is usually abut 50 to 100 μm, but should not be limited to this.

As shown in FIG. 3, external electrode terminal 9 is comprised of column-like electrode 17, insulating layer 16 provided around column-like electrode 17 and annular electrode 15 provided around insulating layer 16. This external electrode terminal 9 may be either formed such that column-like electrode 17 and annular electrode 15 holding insulating layer 16 therebetween remain exposed as electrode terminals, or may be formed in advance with a ball-shaped solder 18 that covers column-like electrode 17 and annular electrode 15 as shown in FIG. 3.

As shown in FIG. 3, column-like electrode 17 is connected to interconnecting pattern 14b formed on the board surface with silicon chip 10 mounted thereon while annular electrode 15 is connected to interconnecting pattern 14c formed on the side opposite to the board surface with silicon chip 10 mounted thereon. Column-like electrode 17 is preferably formed of good conductive metal such as copper, nickel, etc., and as to its size, it is to exemplify a configuration having a diameter of about 50 to 100 μm and that is projected about 50 μm beyond annular electrode 15, though it is not limited to this size.

Figure 1:
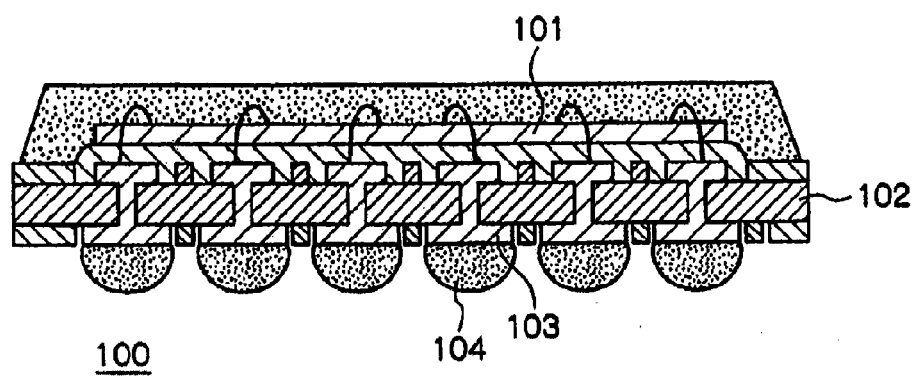
FIG. 1 is a sectional diagram showing a conventional BGA type semiconductor device.
Figure 2:
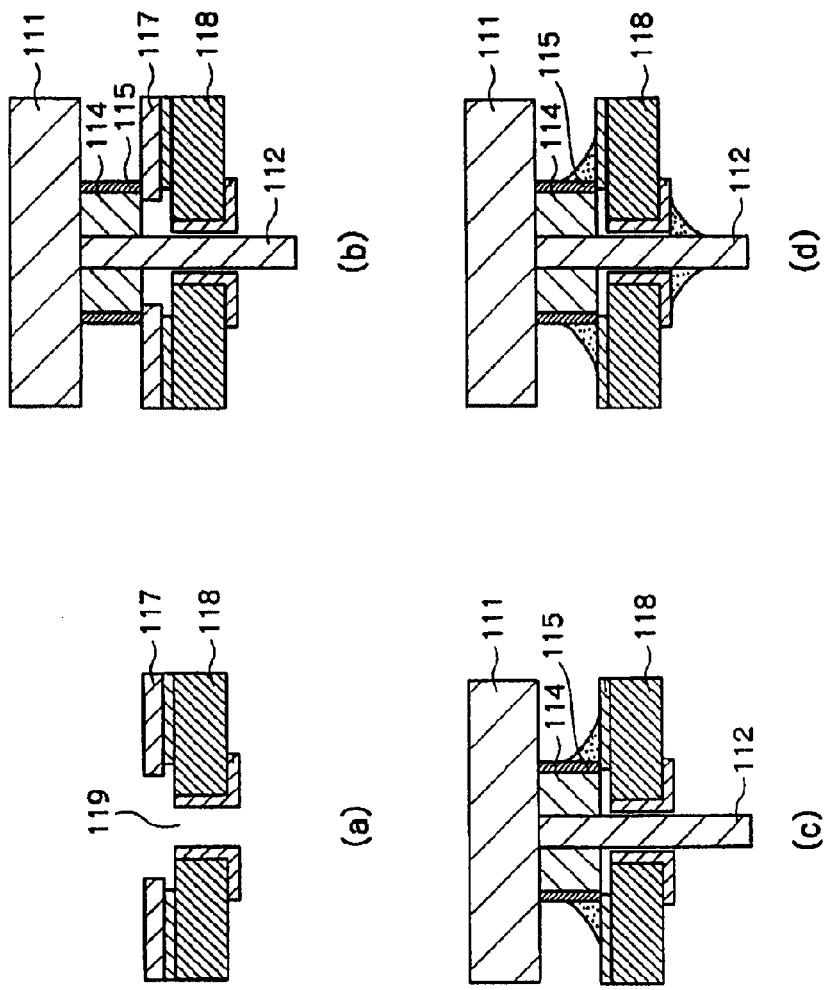
FIG. 2 is a diagram showing a conventional semiconductor device and its mounting method.

On the other hand, annular electrode 15 is also preferably formed of good conductive metal such as copper, nickel, etc. The outside diameter of annular electrode 15 may be set equal to, or different from, the outside diameter of electrode pad 103 of conventional semiconductor device 100 shown in FIG. 1. Also, the other sizes of annular electrode 49 may be modified arbitrarily depending on the electrode pitch, board specifications, etc. For example, when the pitch between annular electrodes 49 is about 0.5 mm, the outside diameter of annular electrode 49 is about 250 μm; and when the pitch between annular electrodes 49 is about 0.8 mm, the outside diameter of annular electrode 49 is about 450 μm. Further, the interior of annular electrode 49 is bored so that the ring width of annular electrode 49 is about 50 to 150 μm, for example.

Insulating layer 16 is provided so that it is held between column-like electrode 17 and annular electrode 15. The thickness in the direction held between column-like electrode 17 and annular electrode 15 is usually and preferably about 20 to 100 μm. If the thickness of insulating layer 16 in the aforementioned direction is less than 20 μm, there is a possibility that column-like electrode 17 and annular electrode 15 will be joined together by solder after being mounted onto the printed wiring board by reflowing. On the other hand, if the thickness of insulating layer 16 in the aforementioned direction exceeds 100 μm, annular electrode 15 that is formed around the insulating layer 16 will become so large that it will be difficult to realize the narrowing of the pitch between external electrode terminals 9.

The height of insulating layer 16, or the dimension of insulating layer 16 in the vertical direction in FIG. 3 is not particularly limited as long as it is equal to or lower than the height of column-like electrode 17 and equal to or higher than the height of annular electrode 15. With insulating layer 16 formed so that its height falls within the above range, when solder paste provided for external electrode terminal 9 becomes molten solder by reflow heating, the molten solder wets and spreads over the individual electrodes and can be separated due to the surface tension of the molten solder itself and due to the presence of insulating layer 16 so as to create an individual solder connection for each electrode.

Here, the height of insulating layer 16 may be approximately the same as that of column-like electrode 17 or may be approximately the same as that of annular electrode 15. The term "approximately the same" in this application indicates a case where the difference falls within the range of ±20 μm. When the height of insulating layer 16 is set at approximately the same as that of column-like electrode 17, column-like electrode 17 and the electrode formed on the printed wiring board can be soldered after insulating layer 16 formed around the column-like electrode 17 has abutted the insulating board of the printed wiring board. As a result, the semiconductor device can be mounted onto the printed wiring board without the solder on column-like electrode 17 being electrically connected to the solder on annular electrode 15. On the other hand, when the height of insulating layer 16 is set at approximately the same as the height of annular electrode 15, there is the advantage in which the size of the via hole for burying external electrode terminal 9 can be made small.

Though the surface of external electrode terminal 9 does not need to be formed with a solder layer, it is preferred that bump-like solder layer 18 that connects the surface of column-like electrode 17 and the surface of annular electrode 15 be formed as shown in FIG. 3. Bump-like solder layer 18 can be formed by, for example, a method of applying solder paste over external electrode terminal 9, or by a method of providing ball-like solder. The solder layer 18 thus formed melts during reflowing after semiconductor device 1 has been mounted onto the printed wiring board and separates due to the surface tension of the molten solder during reflow toward column-like electrode 17 and annular electrode 15 on the different sides of insulating layer 16. As a result, column-like electrode 17 and annular electrode 15 become soldered separately from each other, or are soldered and connected by the separated solders to corresponding electrodes (lower-layer electrode and upper-layer electrode) of the printed wiring board, respectively.

Since in semiconductor device 1 of the present invention, external electrode terminal 9 is formed of column-like electrode 17 and annular electrode 15 as above, it is possible, even in a semiconductor device which looks like a conventional BGA type semiconductor device, to create two electrodes where previously there was only one electrode.

Here, silicon chip 10 that constitutes semiconductor device 1 is not particularly limited; it may be a wire-bonding type or a ball-bonding type. Further, wire 11 used for wire bonding may employ a conventional gold wire etc. Further, as shown in FIG. 3, usually, silicon chip 10 is bonded to board 14 using adhesive 12 but it may be bonded on board 14 by a method other than using adhesives. The type etc. of adhesive 14 is not particularly limited, and adhesives used for similar purposes can be used. After silicon chip 10 has been interconnected to board 14 by wire bonding or the like, the silicon chip 10 is encapsulated by sealing resin 13. The type etc. of sealing resin 13 is not particularly limited, and sealing reins used for similar purposes can be used.

Figure 4:
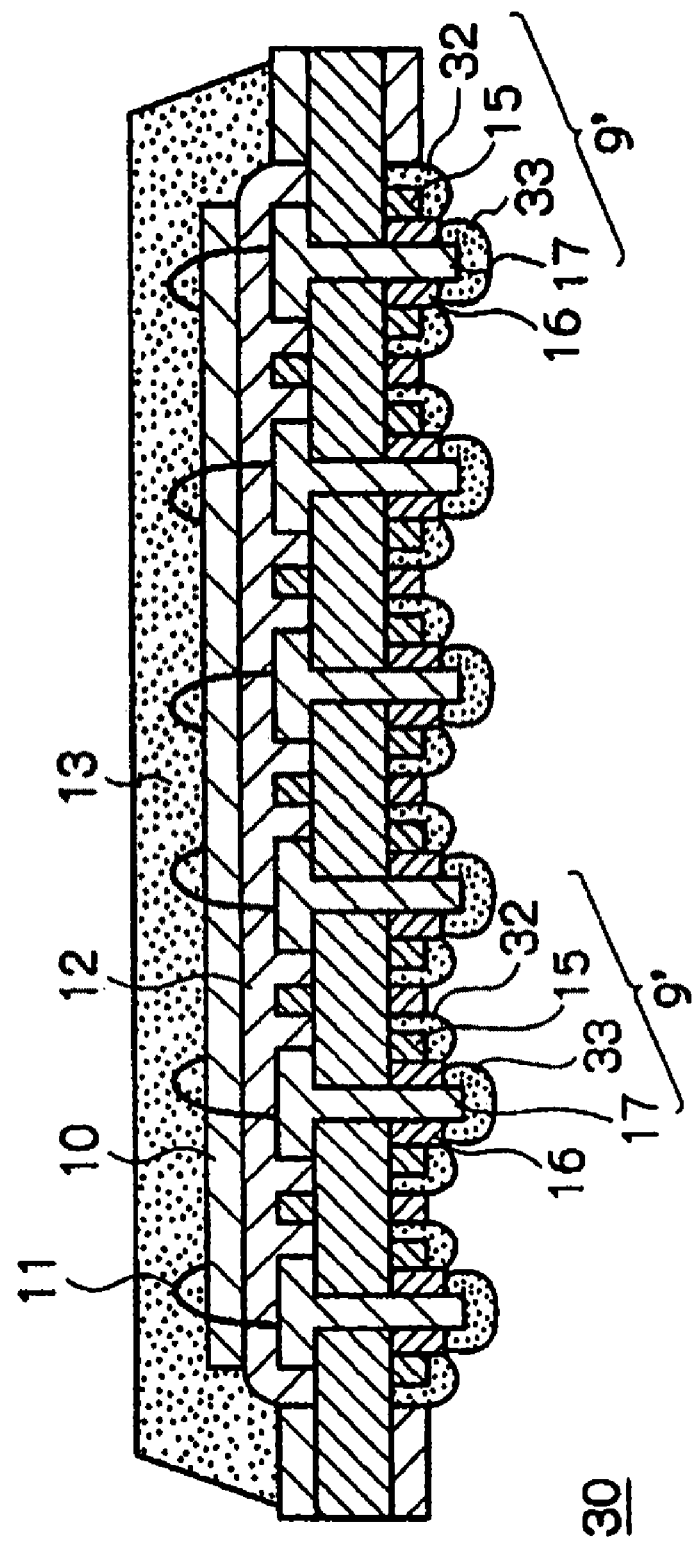
FIG. 4 is a schematic sectional diagram showing another example of a semiconductor device of the present invention.

FIG. 4 is a schematic sectional diagram showing another example of a semiconductor device of the present invention. Semiconductor device 30 shown in FIG. 4 is a semiconductor device which is characterized in that the solder formed in external electrode terminal 9' is separated into solder bump 32 formed solely for annular electrode 15 and solder bump 33 formed solely for column-like electrode 17. That is, two electrodes 15 and 17 holding insulating layer 16 therebetween are formed with individual solder bumps. Here, the components other than this external electrode terminal 9' are the same as those of semiconductor device 1 shown in FIG. 3, so that the description for those using the same reference numerals in semiconductor device 30 shown in FIG. 4 is omitted.

In external electrode terminal 9' in the above form, when solder is supplied to external electrode terminal 9', a small amount of solder paste is supplied by a printing method and then fused so that the molten solder wets and spreads separately over the column-like electrode 17 surface and the annular electrode 15 surface, forming bumps 32 and 33 that are separated from each other. Semiconductor device 30 having external electrode terminals 9' having the above structure has the advantage in which semiconductor device 30 can be examined after its fabrication and before it is mounted onto the printed wiring board.

FIG. 5 is a schematic sectional diagram showing still another example of a semiconductor device of the present invention. Semiconductor device 31 shown in FIG. 5 is a semiconductor device characterized in that its silicon chip mount board is multi-layered board 34. A plurality of silicon chips can be mounted on semiconductor device 31 so that semiconductor device 31 can be multi-chip module or multi-chip package. As multi-layered board 34, various types which are designed by conventional publicly known methods so that a large number of lines can be drawn out when a plurality of silicon chips are used. For example, in semiconductor device 31 shown in FIG. 5, a plurality of similar or dissimilar types of silicon chips 10a and 10b are mounted on multi-layered board 34 which has three insulating boards 34a, 34b and 34c in which copper interconnecting patterns and through-holes, etc. are formed and which insulating boards are laminated. Lines from silicon chips 10a and 10b are connected to external electrode terminals 9" by way of copper interconnecting patterns, through-holes, etc. Here, components other than this multi-layered board 34 are the same as those of semiconductor device 1 shown in FIG. 3, so that the description for those that uses the same reference numerals in semiconductor device 31 shown in FIG. 5 is omitted.

(Manufacturing Method of the Semiconductor Device)

Figure 6:
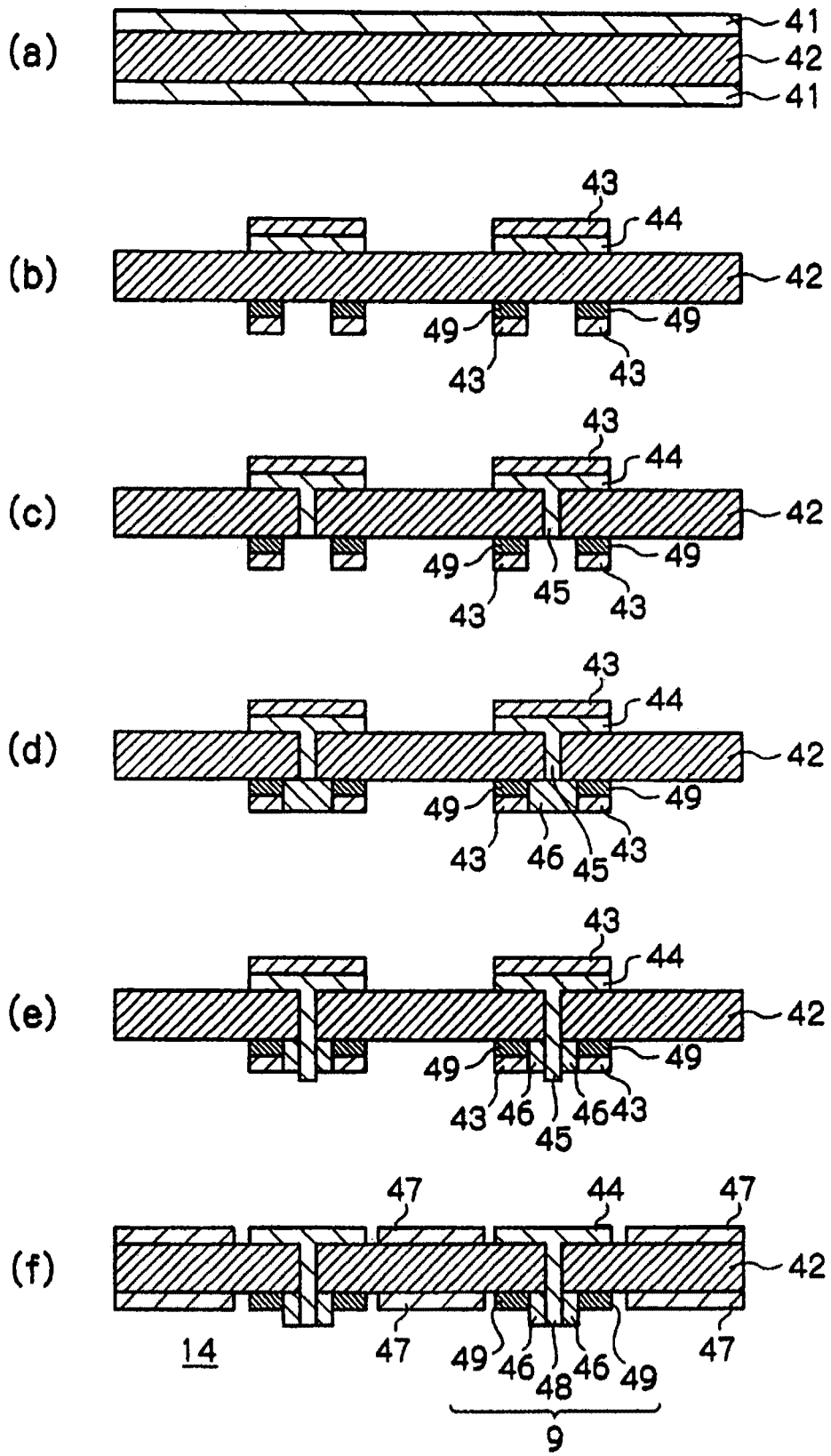
FIG. 6 is a process diagram showing one example of a fabrication method of a silicon chip mount board constituting the semiconductor device shown in FIG. 3.

Next, the method of manufacturing a semiconductor device of the present invention will be described mainly by illustrating a process flow of the board (silicon chip mount board). FIG. 6 is a process diagram showing one example of a fabrication method of silicon chip mount board 14 constituting semiconductor device 1 shown in FIG. 3.

To being with, as shown in FIG. 6(a), a board that is about 50 to 100 μm thick having copper foil 41 applied on both sides of insulating board 42 is prepared. Next, resists 43, 43 that are about 50 μm thick are formed on copper foils 41, 41 on both sides of insulating board 42, then the unnecessary part of copper foil is removed by light exposure and development to form copper interconnecting pattern 44 having a designated configuration on the side on which a silicon chip is mounted, as shown in FIG. 6(b) and an interconnecting pattern for annular electrodes 49 is formed on the opposite side, as the final form shown in FIG. 6(f). Here, the outside diameter of the interconnecting pattern for annular electrodes 49 may be equal to, or different from, the outside diameter of electrode pad 103 of conventional semiconductor device 100 shown in FIG. 1. The other sizes of the interconnecting pattern for annular electrodes 49 may be changed arbitrarily depending on the electrode pitch, board specifications and the like. For example, when the pitch of the interconnecting pattern for annular electrodes 49 is 0.5 mm, the outside diameter is about 250 μm. When the pitch of the interconnecting pattern for annular electrodes 49 is 0.8 mm, the outside diameter is about 450 μm. The opening inside the interconnecting pattern for annular electrode 49 is formed by removing the copper foil so that the ring width will be about 50 to 150 μm.

Next, a carbon dioxide laser or the like is used to form holes having diameters of 50 to 100 μm through insulating board 42, the interior walls of the holes are cleaned, then the holes are buried with conductive material 45 by chemical plating as shown in FIG. 6(c). As conductive material 45, metals such as copper, nickel, etc. can be used. As another method other than plating to make the holes conductive, a printing technique using a conductive paste or other techniques can be considered. Next, as shown in FIG. 6(d), insulating layer 46 is formed inside the hollow of annular electrode 49. As the forming method of insulating layer 46, the material may be selectively supplied by a printing technique or the insulating layer may be formed by light exposure and development after applying a fluid photosensitive over the whole surface.

Next, at the same position as the hole where conductive material 45 was formed, a hole having the same diameter is once again formed by a carbon dioxide laser etc., then the hole is buried again by plating or with conductive paste as shown in FIG. 6(e). Next, resist 43 is removed. Finally, SR (solder resist) 47 is formed as necessary.

Here, though not illustrated in FIG. 6, interconnection to annular electrode 15 can be formed by the procedures of applying a photosensitive material, exposure and development and then etching copper foil.

From the above process, it is possible to obtain silicon chip mount board 14 including column-like electrodes 48 that have a diameter of about 50 to 100 μm and that project about 50 μm, and annular electrodes 49 that have a ring width of about 50 to 150 μm. In the thus formed silicon chip mount board 14, when, for example the pitch between external electrode terminals 9 is 0.5 mm, the outside diameter of annular electrode 49 is about 250 μm, the ring width is about 50 μm and the outside diameter of column-like electrode 48 is about 50 μm, insulating layer 46 of about 50 μm thick will be formed around column-like electrode 48. When, for example the pitch between external electrode terminals 9 is 0.8 mm, the outside diameter of annular electrode 49 is about 450 μm, the ring width is about 100 μm, and the outside diameter of column-like electrode 48 is about 100 μm insulating layer 46 that is about 75 μm thick will be formed around column-like electrode 48.

Semiconductor device 1 shown in FIG. 3 is fabricated by mounting silicon chip 10 on the thus obtained silicon chip mount board 14 with adhesive 12 therebetween, connecting silicon chip 10 terminals and the interconnecting pattern on board 14 by wire bonding 11, then encapsulating resin 13 over it, and finally supplying solder 18 on external electrode terminals 9.

As a method of supplying solder, the method of placing solder balls and a printing technique can be mentioned. In the method of placing solder balls, flux is applied over the solder supplied surface in advance, then solder balls are placed at the centers of column-like electrodes using a jig tool such as a sieve etc. Since solder balls are extremely light, they can be supplied without rolling down, owing to the adhesiveness of the flux. Subsequently, the solder balls are fused by reflowing so as to attach the solder to the external electrode terminals. On the other hand, in the method of supplying solder by printing, cream solder is printed over the external electrode terminals using a metal mask, then the cream solder is fused by reflowing so as to attach the solder to the external electrode terminals. From these methods, it is possible to produce the semiconductor device of the present invention shown in FIG. 3. Here, though semiconductor device 1 of the present invention shown in FIG. 3 shows an example in which silicon chip 10 and board 14 are connected by wire bonding, connection can be done using a flip-chip technique, TAB technique or a connecting technique using molten solder.

Figure 7:
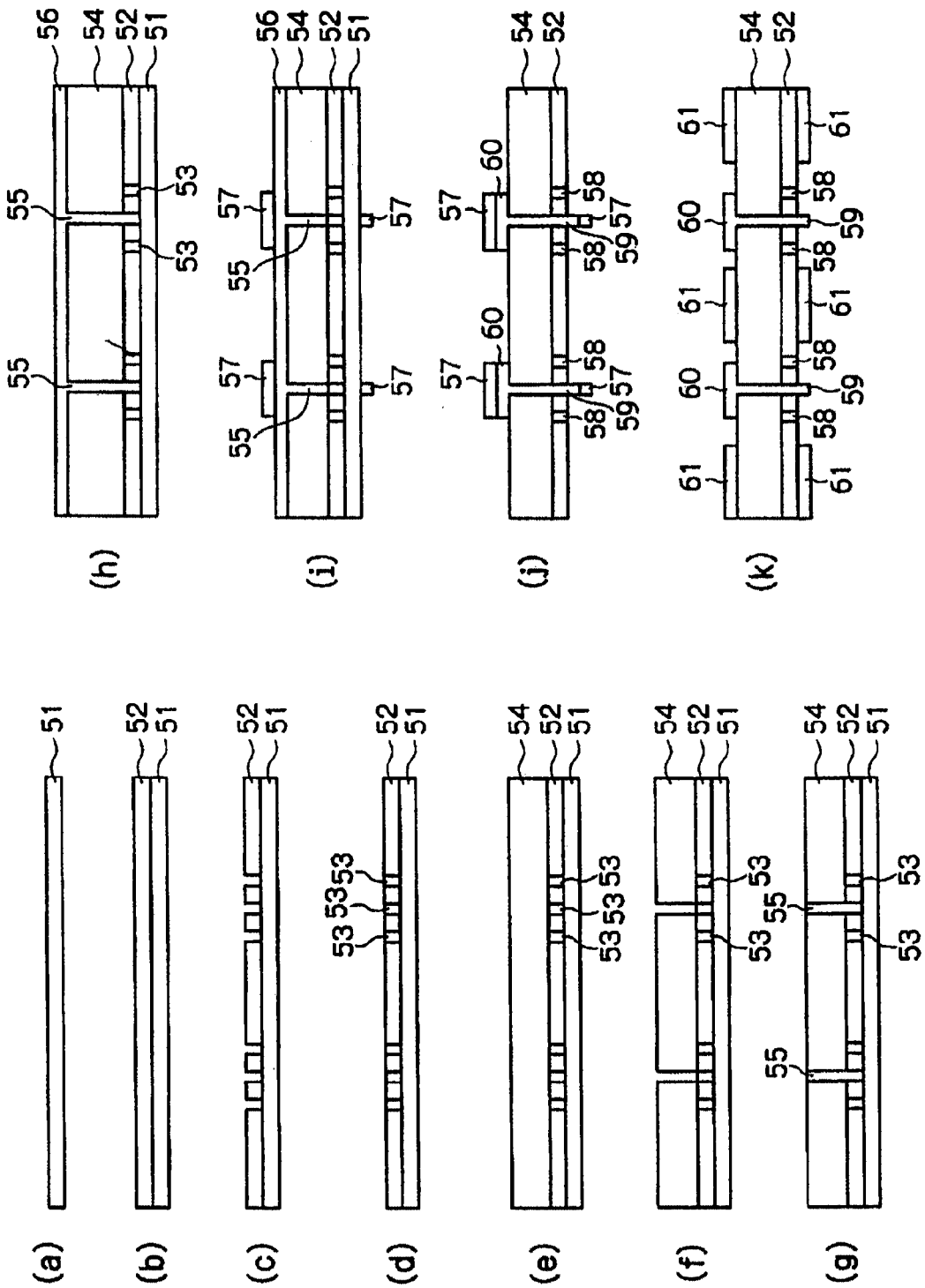
FIG. 7 is a process diagram showing another example of a fabrication method of a silicon chip mount board constituting the semiconductor device shown in FIG. 3.

Next, another method of fabricating a semiconductor device of the present invention will be described mainly by illustrating of a process flow of the board (silicon chip mount board). FIG. 7 is a process diagram showing another example of a fabrication method of silicon chip mount board 14 constituting semiconductor device 1 shown in FIG. 3, which shows a fabrication method different from that shown in FIG. 6.

First, as shown in FIG. 7(a), copper foil 51 is prepared. Then, as shown in FIG. 7(b), resin such as epoxy etc. is applied or adhered to one surface of copper foil 51 to form insulating layer 52. Next, as shown in FIG. 7(c), unnecessary resin is removed by illuminating carbon dioxide laser etc. at predetermined portions. As the resin applied on copper foil 51 in FIG. 7(b), a photosensitive insulating resin can be used, and in this case, unnecessary resin can be removed by light exposure and development. The thickness of insulating layer 52 being formed herein is preferably equal to or below about 50 μm in order to allow for easy removal of unnecessary resin.

Next, plating 53 shown in FIG. 7(d) is deposited by electric plating or chemical plating in the areas where resin was removed in FIG. 7(c). As the plating metal, copper and nickel are suitable. Here, instead of plating 53, conductive plate may be used to burry. Next, as shown in FIG. 7(e), epoxy resin etc. is applied to or adhered to, forming insulating layer 54. Next, arbitrary portions of the area where plating 53 was formed in FIG. 7(d) alone are irradiated with carbon dioxide laser etc., to form holes penetrating through insulating layer 54. Next, plating 55 is deposited as shown in FIG. 7(g) in the holes formed in FIG. 7(f) by electric plating or chemical plating.

Further, as shown in FIG. 7(h), a layer of plating 56 is formed on one side of insulating layer 54 by a plating process. Next, as shown in FIG. 7(i), resist 57 is formed over plating 56 and over copper foil 51 on the rear side, then unnecessary portions of copper foil 51 and plating 56 are removed by etching to form circuit 60, annular electrodes 58 and column-like electrodes 58 as shown in FIG. 7(i). Here, when plating 53 of nickel, gold, tin or the like is deposited at the step of FIG. 7(d) after removal of unnecessary resin at the step of FIG. 7(c), it is possible to expect the effect in which annular electrodes 58 and the circuit formed on this surface during etching at the step of FIG. 7(j) are protected. Next, after separation of resist 57, SR(solder resist) 61 is formed to complete silicon chip mount board, as shown in FIG. 7(k).

In the external electrode terminal on the silicon chip mount board produced by the process shown in FIG. 6, the height of insulating layer 46 formed between annular electrode 49 and column-like electrode 48 is approximately the same as that of column-like electrode 48, but in the external electrode terminal on the silicon chip mount board produced by the process shown in FIG. 7, the height of insulating layer 52 is approximately the same as that of annular electrode 58. As a result, when a semiconductor device using the silicon chip mount board produced by the process shown in FIG. 7 is mounted onto the printed wiring board, there is the advantage that the holes in the electrode portions of the printed wiring board where column-like electrodes 59 are inserted can be made shallow.

Figure 8:
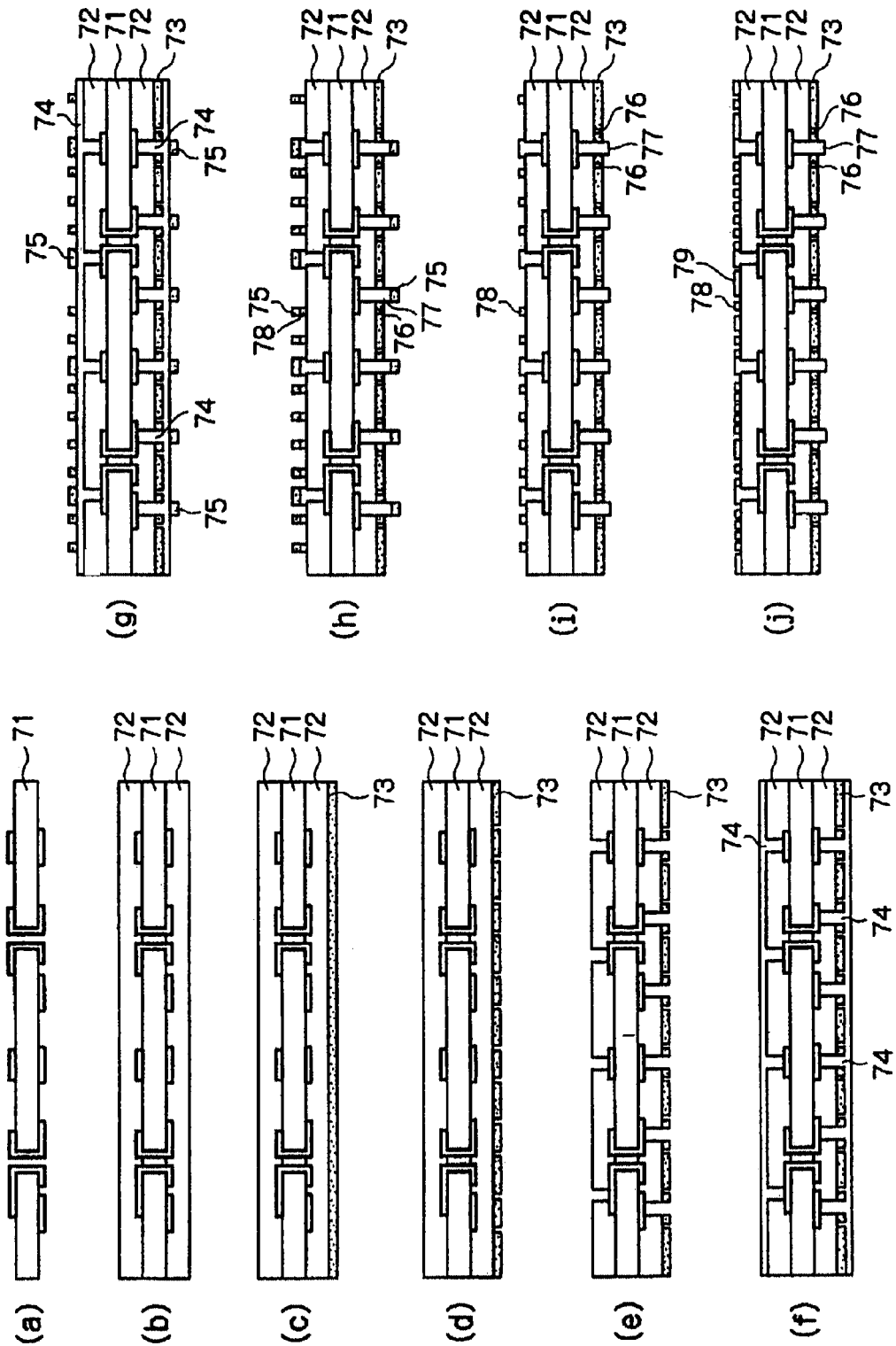
FIG. 8 is a process diagram showing one example of a fabrication method when a silicon chip mount board constituting a semiconductor device is a multi-layered board.

Next, a fabrication process when the silicon chip mount board is a multi-layered board will be described. FIG. 8 is a process diagram showing one example of a fabrication method when a silicon chip mount board constituting a semiconductor device is a multi-layered board.

FIG. 8(a) shows board 71 fabricated by the process of manufacturing a usual interconnection board. This board 71 may be either a dual-sided board or a multi-layered board. Next, as shown in FIG. 8(b), insulating layer 72 is laminated by heating or pressurizing on both sides of board 71. Next, as shown in FIG. 8(c) photosensitive resin layer 73 is formed on one side of the resultant board. This photosensitive resin layer 73 may be formed either by applying a fluid resin or by adhering a sheet. Next, as shown in FIG. 8(d), unnecessary portions of photosensitive resin layer 73 are removed by light-exposure and development. Next, as shown in FIG. 8(e), a hole is made in insulating layers 72, 72 laminated on both sides by using carbon dioxide laser etc. The hole is a hole that reaches the interconnection provided on both sides of board 71.

Next, as shown in FIG. 8(f), a plating process is performed to form plating 74 in the holes formed on both sides and on the board surfaces. Next, as shown in FIG. 8(g), resist 75 is formed on both sides of plating 74 surfaces, and unnecessary portions on both sides of plating 74 are removed as shown in FIG. 8(h). In this way, circuit 78, annular electrodes 76 and column-like electrodes 77 are formed. Next, as shown in FIG. 8(i), after removal of resist 75, SR 79 is formed to complete a multi-layered board shown in FIG. 8(j).

(Printed Wiring Board)

Figure 9:
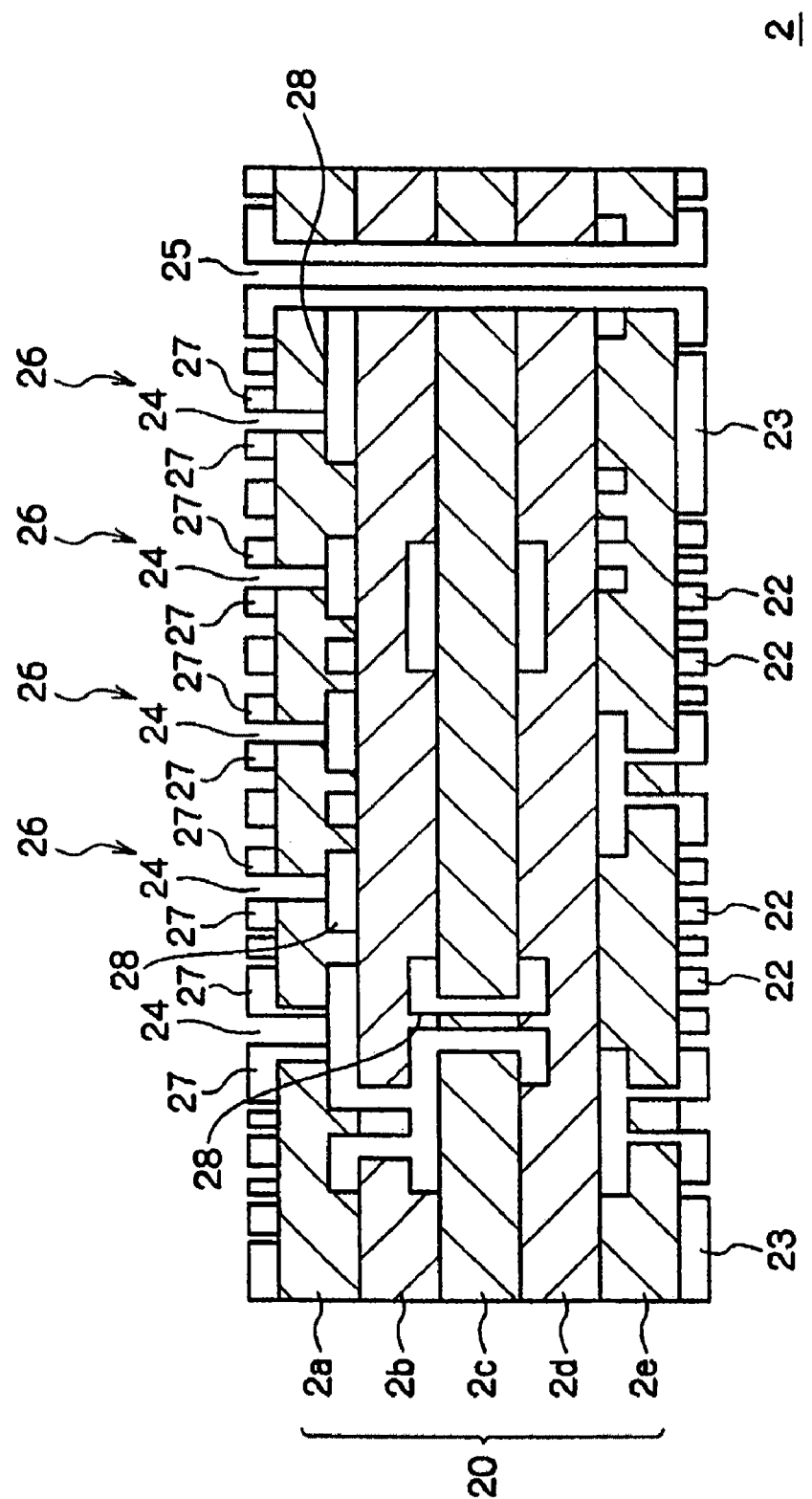
FIG. 9 is a schematic sectional diagram showing a fabrication method of a printed wiring board used in the first exemplary embodiment of the present invention.

FIG. 9 is a schematic sectional diagram showing one example of a printed wiring board of the present invention. Printed wiring board 2 of the present invention shown in FIG. 9 is characterized by mount portion 26 as an electrode pad for mounting the aforementioned semiconductor device 1 of the present invention, and has the same configuration as that of the printed wiring board of a conventional build-up board type other than the mount portion 26. Hereinbelow, mount portion 26 will be mainly described.

Printed wiring board 2 of the present invention is a multi-layered wiring board comprised of a plurality of layers (five layers 2a, 2b, 2c, 2d and 2e in FIG. 9). Formed on its one side where a semiconductor device is mounted are mount portions 26 to which wires from the semiconductor device are connected. Formed on the other side is external layer circuit 22 to be connected to external circuits. Each layer that constitutes printed wiring board 2 is formed with inner layer circuits while through-holes and conductive portions are formed between the layers.

Mount portion 26 is formed with a hole (which will be referred to hereinbelow as a via hole) 24 that is connected to the lower layer portion. Formed on the lower layer surface at the bottom of via hole 24 is lower-layer electrode 28. Also, upper-layer electrode 27 having a ring shape is formed on the surface layer around via hole 24. The thus constructed mount portion 26 is comprised of two electrodes which used to be one electrode.

Mount portion 26 as an electrode pad is comprised of annular upper-layer electrode 27, a bore which is connected to the lower layer at the center thereof and lower-layer electrode 28 provided in the lower layer. Though FIG. 9 shows an example in which lower-layer electrode 28 is formed on the second layer surface, it may be formed on the third layer surface or the fourth layer surface.

Though the size of annular upper-layer electrode 27 that constitutes printed wiring board 2 varies depending on, the pitch of upper-layer electrodes 27 and the specification of printed wiring board 2 and the fabrication condition of printed wiring board 2, it is preferred that the size be almost the same as the outside diameter of the annular electrode on the semiconductor device side to be mounted, and that the ring width of annular upper-layer electrode 27 be about 50 to 150 µm. When the pitch between upper-layer electrodes 27 is about 0.5 mm, the outside diameter of upper-layer electrode 27 is preferably about 250 µm. When the pitch between upper-layer electrodes 27 is about 0.8 mm, the outside diameter of upper-layer electrode 27 is preferably about 450 µm.

(Fabrication Method of the Printed Wiring Board)

Next, a fabrication method of the printed wiring board of the present invention will be described. FIG. 10 is a process diagram showing one example of a fabrication method of the printed wiring board shown in FIG. 9. To begin with, as shown in FIG. 10(a), printed wiring board 81 manufactured by a conventional fabrication method is prepared. The surface layer of printed wiring board 81 is formed with interconnections which will finally form lower-layer electrodes 90 at the hole bottom shown in FIG. 10(g).

Next, insulating layer 82 is formed on both sides of printed wiring board 81 as shown in FIG. 10(b). The method of forming insulating layer 82 is the same as that for a usual buildup board, and can be done by laminating a copper deposited insulating material or using other methods. Then, as shown in FIG. 10(c), holes 83 are formed at predetermined positions on both sides using a carbon dioxide laser etc. Next, plating 84 is deposited on the surface of insulating layers 82 formed on both sides as shown in FIG. 10(e). Then, after resist 85 is formed on both sides as shown in FIG. 10(e), light exposure and development and then removal of unnecessary plated portions are performed to form circuits 86 as shown in FIG. 10(f). At this timing, annular upper-layer electrodes 89 shown in FIG. 10(g) are formed simultaneously.

Next, as shown in FIG. 10(g), a hole having a diameter of about 80 to 150 µm is formed in the center of annular upper-layer electrode 89 using a carbon dioxide laser. This hole is formed vertically or taperingly from the first to second layers, so as to expose lower-layer electrode 90 at the bottom of the hole. The depth of the hole is the thickness of insulating layer 82 between the first and second layers, usually about 70 µm or below. For example; when the pitch between annular upper-layer electrodes 89 is about 0.5 mm, it is preferable that the outside diameter of annular upper-layer electrode 89 be about 250 µm and that the ring width be 50 µm with a hole having a diameter of 100 µm formed taperingly in its center. On the other hand, when the pitch between annular upper-layer electrodes 89 is about 0.8 mm, it is preferable that the outside diameter of annular upper-layer electrode 89 be about 450 µm and that the ring width be 100 µm with a hole having a diameter of 150 µm formed taperingly in its center. In practice, the design values are preferably determined so that the column-like electrodes of the semiconductor device can be inserted. In this way, upper-layer electrodes 89 and lower-layer electrodes 90 at the hole bottom that are to be mounted onto the semiconductor device of the present invention are formed. Then, after removal of resist 85, SR 91 is finally formed to thereby provide printed wiring board 2 shown in FIG. 10(g).

(The Connecting Structure Between the Semiconductor Device and the Printed Wiring Board)

Figure 11:
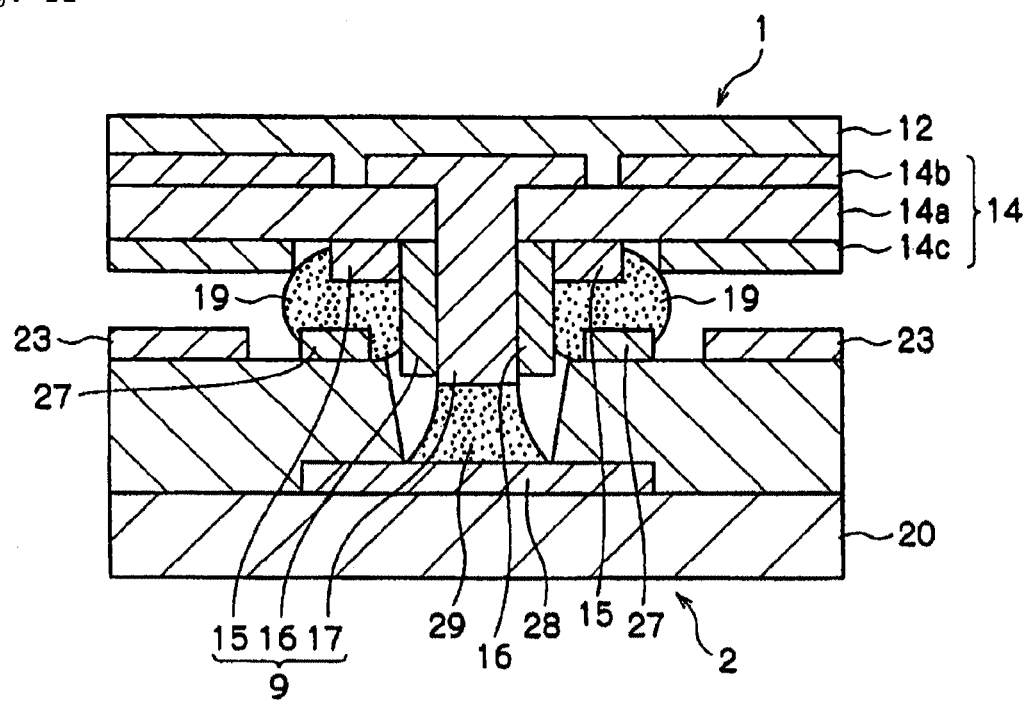
FIG. 11 is a schematic sectional diagram showing one example of a printed wiring board shown in FIG. 9.

FIG. 11 is a schematic sectional diagram showing one example of a connecting structure of the present invention that shows the connecting structure between the above-described semiconductor device and the printed wiring board of the present invention.

The connecting structure of the present invention is a connecting structure between a BGA type semiconductor device and a printed wiring board. As BGA type semiconductor device 1, semiconductor device 1 including external electrode terminals 9 made up of column-like electrode 17, insulating layer 16 formed around this column-like electrode 17 and annular electrode 15 formed around the insulating layer 16 as shown in FIG. 3 for instance is prepared. Also, as printed wiring board 2 on which this semiconductor device 1 will be mounted, printed wiring board 2 including annular upper-layer electrodes 27 with an electrode pad formed on the surface layer, holes (via holes 24) connected from the center of the upper-layer electrodes to the lower layer and lower-layer electrodes 28 formed in the lower layer as shown in FIG. 9 for instance will be prepared. This connecting structure between semiconductor device 1 and printed wiring board 2 is constructed such that column-like electrode 17 of semiconductor device 1 is inserted into the hole of mount portion 26 of printed wiring board 2, and the column-like electrode 17 and lower-layer electrode 28 at the bottom of the hole are connected with solder 29. Annular electrode 15 of semiconductor device 1 is connected to annular upper-layer electrode 27 in mount portion 26 of printed wiring board 2 by way of solder 19. Further, insulating layer 16 of semiconductor device 1 and insulating layer 20 of printed wiring board 2 come into contact with each other to insulate the two electric connections from each other.

Accordingly, since in the connecting structure of the present invention two solder-connected portions are formed instead of the conventional connecting structure in which only a single solder-connected portion used to be formed, it is possible to reduce the area required for the arrangement of electrodes by approximately half. It is therefore possible to increase the number of electrodes by approximately double, compared to the conventional BGA type semiconductor device, hence a semiconductor device having an increased number of pins can be realized without narrowing the pitch between external electrode terminals and without enlarging the size of the semiconductor device, and can be easily mounted onto the printed wiring board. Further, in the conventional BGA type semiconductor device, if it is not necessary to increase the number of external electrodes, adoption of the connecting structure of the present invention makes it possible to enlarge the pitch between electrodes, hence to improve the mounting quality and reliability when the device is mounted onto the printed wiring board.

Specifically, in the conventional BGA type semiconductor device, the number of external electrode terminals reaches a maximum level when they are arrayed at all the grid points. For example, when the semiconductor device has a size of 10 mm×10 mm, there are about 144 external electrode terminals when the pitch between external electrode terminals is about 0.8 mm. There are about 400 external electrode terminals when the pitch between external electrode terminals is about 0.5 mm. However, in the connecting structure of the present invention, when the semiconductor device has the same size, about 288 external electrode terminals can be formed when the pitch between the external electrode terminals is about 0.8 mm, and about 800 external electrode terminals can be formed when the pitch between the external electrode terminals is about 0.5 mm. Accordingly, it is possible to obtain semiconductor devices having an increased number of pins or external electrode terminals without changing the size and pitch.

Further, when the connecting structure of the present invention is directly applied to a conventional BGA type semiconductor device, it is possible to reduce the area required for the arrangement of external electrode terminals by approximately half. In the above example, when the size and the number of external electrode terminals of the semiconductor device are unchanged, it is possible to enlarge the pitch between external electrode terminals. Specifically, in the former case, the pitch can be widened to about 1.0 mm, and in the latter case, the pitch can be widened to about 0.65 mm. Since it is possible to enlarge the electrode size for each when the pitch of external electrode terminals is widened, it is possible to improve the mounting quality and the connection strength. Further, in the above example, when the pitch of the external electrode terminals and their number are unchanged, the semiconductor device can be made smaller in size. In the former case, the size can be reduced to about 6.5 mm×6.5 mm, and in the latter case, the size can be reduced to about 7 mm×7 mm. As a result, higher packaging densities can be achieved, thereby providing an advantage for miniaturizing electronic appliances.

(Connecting Method Between the Semiconductor Device and Printed Wiring Board)

Next, the connecting method will be described with reference to FIG. 11. Semiconductor device 1 is mounted onto printed wiring board 2 by a conventional surface mounting technology.

First, printed wiring board 2 shown in FIG. 9 is prepared. Cream solder is supplied, using a metal mask, to the electrode portions where various surface mount parts (not shown) are to be provided. When cream solder is supplied to the electrode portions, it is preferred that the amount of cream solder to be supplied to the areas of annular upper-layer electrodes 27 and lower-layer electrodes 28 at the hole bottom, formed in printed wiring board 2, be reduced to as little as possible by controlling the sizes and shapes of the apertures of the metal mask, the thickness of half etching, etc. Further, for the areas of annular upper-layer electrodes 27 and lower-layer electrodes 28 at the hole bottom, flux alone may be supplied instead of cream solder.

Next, the various surface mount parts are mounted. Semiconductor device 1 shown in FIG. 3 is also mounted at the same time. Then, solder 18 and the supplied cream solder are melted by reflow heating. When the solder melts, the molten solder separates toward the two connecting sections because of its surface tension, so that annular electrode 15 on the semiconductor device 1 side and annular upper-layer electrode 27 on the printed wiring board 2 side are joined by solder 19. Also, column-like electrode 17 on the semiconductor device 1 side and lower-layer electrode 28 at the hole bottom on the printed wiring board 2 side are joined by solder 29. The solder joint between annular electrode 15 on the semiconductor device 1 side and annular upper-layer electrode 27 on the printed wiring board 2 side enables adjustment of the mounted position of semiconductor device 1 (self-alignment effect). This positional adjustment makes it possible to achieve a solder joint between column-like electrode 17 on the semiconductor device 1 side and lower-layer electrode 28 at the hole bottom on the printed wiring board 2 side in such a form that semiconductor device 1 is sunk into the printed wiring board 2 side. Solder joint in this form makes insulating layer 16 between column-like electrode 17 and annular electrode 15 of semiconductor device 1 and insulating layer 20 between the first layer and second layer of printed wiring board 2 come into contact with each other to insulate the two joined portions from each other.

The method described heretofore, makes it possible to mount semiconductor device 1 shown in FIG. 3 onto printed wiring board 2 shown in FIG. 9 and to manufacture the connecting structure shown in FIG. 11.

The invention claimed is:

1. A semiconductor device of a BGA type formed with external electrode terminals on the side that is mounted onto a printed wiring board, wherein
said external electrode terminal includes: a columnar electrode; an insulating layer formed around the columnar electrode; and an annular electrode mounted on said printed wiring board, formed around the insulating layer and that directly covers an outer circumferential surface of the insulating layer.

2. The semiconductor device according to claim 1, wherein the height of said insulating layer is approximately equal to that of said columnar electrode.

3. The semiconductor device according to claim 2, wherein a bump-like solder layer that joins the surface of said column-like electrode and the surface of said annular electrode is formed on the surface of said external electrode terminal.

4. The semiconductor device according to claim 2, wherein a bump-like solder layer formed on the surface of said column-like electrode and a circular solder layer formed on the surface of said annular electrode are formed separately on the surface of said external electrode terminal.

5. The semiconductor device according to claim 1, wherein the height of said insulating layer is approximately equal to that of said annular electrode.

6. The semiconductor device according to claim 5, wherein a bump-like solder layer that joins the surface of said column-like electrode and the surface of said annular electrode is formed on the surface of said external electrode terminal.

7. The semiconductor device according to claim 5, wherein a bump-like solder layer formed on the surface of said column-like electrode and a circular solder layer formed on the surface of said annular electrode are formed separately on the surface of said external electrode terminal.

8. The semiconductor device according to claim 1, wherein a solder layer that directly contacts the surface of said columnar electrode and the surface of said annular electrode is formed on the surface of said external electrode terminal.

9. The semiconductor device according to claim 1, wherein a bump-like solder layer formed on the surface of said column-like electrode and a circular solder layer formed on the surface of said annular electrode are formed separately on the surface of said external electrode terminal.

10. A printed wiring board, on which a semiconductor device of a BGA type including external electrode terminals can be mounted, comprised of a column-like electrode; an insulating layer formed around the column-like electrode; and an annular electrode formed around the insulating layer, and which includes electrode pads corresponding to said external electrode terminals,
wherein said electrode pad comprises: a lower-layer electrode to be soldered to the column-like electrode of said external electrode terminal; and an upper-layer electrode to be soldered to the annular electrode of said external electrode terminal.

11. The printed wiring board according to claim 10, wherein the lower-layer electrode to be soldered to said column-like electrode is formed at the bottom of a hole that is formed on the printed wiring board surface, and the upper-layer electrode to be soldered to said annular electrode is formed on the printed wiring board surface in an annular form that is approximately the same as said annular electrode.

12. A connecting structure between a semiconductor device of a BGA type which has external electrode terminals formed on the side that is mounted onto a printed wiring board, the external electrode terminal comprising a column-like electrode, an insulating layer formed around the column-like electrode and an annular electrode formed around the insulating layer and a printed wiring board on which said semiconductor device can be mounted and comprising an electrode pad that has a lower-layer electrode to be soldered to the column-like electrode of said external electrode terminal and an upper-layer electrode to be soldered to the annular electrode of said external electrode terminal, wherein the column-like electrode of said semiconductor device is soldered to the lower-layer electrode of said printed wiring board and the annular electrode of said semiconductor device is soldered to the upper-layer electrode of said printed wiring board.

13. The connecting structure according to claim 12, wherein the lower-layer electrode to be soldered to said column-like electrode is formed at the bottom of a hole formed on the printed wiring board surface, and the upper-layer electrode to be soldered to said annular electrode is formed on the printed wiring board surface in an annular form that is approximately the same as said annular electrode.

14. The connecting structure according to claim 13, wherein the height of said insulating layer is approximately equal to that of said column-like electrode.

15. The connecting structure according to claim 13, wherein the height of said insulating layer is approximately equal to that of said annular electrode.

16. The connecting structure according to claim 12, wherein the height of said insulating layer is approximately equal to that of said column-like electrode.

17. The connecting structure according to claim 12, wherein the height of said insulating layer is approximately equal to that of said annular electrode.

* * * * *